United States Patent [19]

Shibata

[11] Patent Number: 5,750,153
[45] Date of Patent: May 12, 1998

[54] MOLD DEVICE AND PROCESS FOR RESIN-PACKAGING SEMICONDUCTOR DEVICES

[75] Inventor: Kazutaka Shibata, Kyoto, Japan

[73] Assignee: Rohm Co. Ltd., Kyoto, Japan

[21] Appl. No.: 704,978

[22] Filed: Aug. 28, 1996

[30] Foreign Application Priority Data

Aug. 31, 1995 [JP] Japan .................. 7-223456

[51] Int. Cl.⁶ .................. B29B 45/02; B29B 45/14; B29B 45/27
[52] U.S. Cl. .................. 425/116; 425/117; 425/190; 425/544; 425/572; 425/588
[58] Field of Search .................. 425/116, 190, 425/117, 544, 572, 588, DIG. 228; 264/272.17, 328.8, 328.12; 249/107, 105, 109, 110

[56] References Cited

U.S. PATENT DOCUMENTS

| | | | |
|---|---|---|---|
| 5,123,826 | 6/1992 | Baird | 264/272.17 |
| 5,302,101 | 4/1994 | Nishimura | 264/272.17 |
| 5,635,220 | 6/1997 | Izumi et al. | 425/116 |
| 5,645,864 | 7/1997 | Higuchi | 425/116 |

FOREIGN PATENT DOCUMENTS

| | | | |
|---|---|---|---|
| 63-5538 | 1/1988 | Japan | |
| 2-9142 | 1/1990 | Japan | 264/272.17 |

*Primary Examiner*—Khanh P. Nguyen
*Attorney, Agent, or Firm*—Michael D. Bednarek; Kilpatrick Stockton LLP

[57] ABSTRACT

A mold device for resin-packaging semiconductor devices is provided which includes a first cavity block having a first molding cavity, a second cavity block having a second molding cavity in corresponding relation to the first molding cavity, and a gate for injecting a resin material into the first and second cavities through a runner. The gate is defined between an opposed pair of first and second gate pins at a corresponding corner portion of each molding cavity. The first gate pin is removably insertable into the first cavity block, whereas the second gate pin is removably insertable into the second cavity block. Further, the gate is directly open to both of the first and second molding cavities.

7 Claims, 11 Drawing Sheets

1

MOLD DEVICE AND PROCESS FOR RESIN-PACKAGING SEMICONDUCTOR DEVICES

BACKGROUND OF THE INVENTION

1. Field of the Invention

The present invention relates to a mold device which is used for resin-packaging semiconductor devices such as ICs, LSIs and certain types of gate arrays. The present invention also relates to a process for resin-packaging semiconductor devices by using such a mold device.

2. Description of the Related Art

As is well known, semiconductor devices such as ICs are normally enclosed in a resin package for protection. Such a resin package is typically formed by injection or transfer molding, as disclosed in Japanese Patent Application Laid-open No. 63-5538 for example. For the convenience of description, reference is now made to FIGS. 13 through 15 of the accompanying drawings which illustrate the mold device disclosed in this Japanese document.

As shown in FIGS. 13 and 15, the prior art mold device comprises a lower cavity block 5C having a plurality of lower molding cavities 97a (only two shown in FIG. 15), an upper molding cavity 5D having a plurality of upper molding cavities 97b in corresponding relation to the lower molding cavities 97a, and a runner block 59 having a plurality of runner grooves 53e in communication with the respective lower molding cavities 97a through different gates 98. As shown in FIG. 14, each of the gates 98 is provided by a wedge-like gate insert 6C which is removably received in an anchoring recess 96 formed between the lower cavity block 5C and the runner block 59. In the illustrated example, each of the lower molding cavities 97a is rectangular with four sides 99a–99d, and each of the gates 98 is open to a corresponding lower molding cavity 97a at one side 99a thereof.

In use of the prior art mold device for resin-packaging, a leadframe 2e carrying a plurality of semiconductor chips 3e is interposed between the lower and upper cavity blocks 5C, 5D in a manner such that each semiconductor chip 3e is placed in a corresponding pair of lower and upper molding cavities 97a, 97b.

In this condition, a fluid resin material is injected under pressure into each lower molding cavity 97a through the corresponding runner groove 53e and gate 98. As a result, the injected resin material fills the lower molding cavity 97a and then flows upward into the upper molding cavity 97b through various openings (not shown) of the leadframe 2e.

The fluid resin material may contain a hardness enhancing filler, so that each gate 98 (namely the gate insert 6C) may be worn out after repetitive use of the mold device. In such an event, the gate insert 6C alone may be replaced by utilizing its removability. However, the prior art mold device has been found disadvantageous in the following respects.

First, in the prior art mold device, since the gate insert 6C defines a part of the lower molding cavity 97, the insert 6C need be in the form of a relatively wide plate wedge. Thus, after finishing the resin-packaging operation, the gate insert 6C will inevitably leave a relatively large mark or vestige on a side surface of the molded resin package, thereby deteriorating the appearance of the package.

Secondly, due to the large size and wedge-like plate form of the gate insert 6C, it is rather troublesome to produce the insert 6C with high dimensional accuracy. Further, since the recess 96 for receiving the gate insert 6C need be correspondingly sized and shaped, it is also difficult to form the recess 96 with high dimensional accuracy. As a result, the production cost of the prior art mold device becomes rather high.

In the third place, the gate 98 provided by the gate insert 6C is open to the lower molding cavity 97a at one side 99a thereof, so that the resulting resin package will inevitably have an excess gate resin burr at that side. Though the excess gate resin burr is later removed by cutting, it will leave a slightly projecting vestige in an outstanding manner due to the location of the original gate resin burr. As a result, the appearance of the molded resin package may be accordingly deteriorated, and the projecting vestige may cause a dimensional deviation.

In the fourth place, the prior art mold device is not usable for resin-packaging a QFP (Quad Flat Package) type semiconductor device which has a multiplicity of leads projecting out from four sides of the package. Specifically, since the gate 98 of the prior art mold device is located at one side 99a of the lower molding cavity 97a, the leads of the semiconductor device cannot be made to project out from this side 99a.

In the fifth place, since the gate 98 is directly open only to the lower molding cavity 97a, a fluid resin material first fills the lower molding cavity 97a and then flows into the upper molding cavity 97b across the leadframe 2e. Thus, when the resin material flows into the upper molding cavity 97b, the leadframe 2e may be upwardly warped or deformed under the resin injection pressure. As a result, a rejectable product of semiconductor device may be provided wherein some parts of the semiconductor device suffer positional deviations within the molded resin package.

SUMMARY OF THE INVENTION

It is, therefore, an object of the present invention to provide a resin-packaging mold device which is capable of eliminating or at least reducing the above-described problems of the prior art mold device.

Another object of the present invention is to provide a process for advantageously resin-packaging semiconductor devices with the use of such a mold device.

According to one aspect of the present invention, there is provided a mold device for resin-packaging semiconductor devices comprising:

a first cavity block having a first molding cavity;

a second cavity block having a second molding cavity in corresponding relation to the first molding cavity; and a gate for injecting a resin material into the first and second cavities through a runner;

wherein the gate is defined between an opposed pair of first and second gate pins at a corresponding corner portion of each molding cavity, the first gate pin being separate from but removably insertable into the first cavity block, the second gate pin being separate from but removably insertable into the second cavity block, the gate being directly open to both of the first and second molding cavities.

With the structure described above, since the first and second gate pins are separate from the first and second cavity blocks and therefore removable therefrom, they may be replaced alone without any need for the mold device as a whole when worn out. Further, since the gate defined between the first and second gate pins is directly open to both of the first and second molding cavities, the resin material may be made to flow simultaneously into the two cavities, so that the leadframe placed in the mold device for packaging is prevented from warping under injection pressure difference between the two molding cavities. As a result, the packaged semiconductor device will be unlikely to suffer positional deviations with respect to the semiconductor chip and the leads.

Preferably, each of the first and second gate pins has a stem which is circular in cross section, and each of the first and second cavity blocks may also have a circular pin insertion bore for removably inserting the stem. In this case, both of the gate pins as well as both of the cavity blocks can be made to have a simple configuration, as opposed to the prior art mold device wherein the gate is provided by a plate member which need be fixed in a correspondingly shaped recess of one cavity block. Thus, the mold device can be manufactured very easily at a lower cost.

Advantageously, each of the first and second gate pins has a rear end formed with a non-circular flange for non-rotatably fitting in a non-circular recess which is formed in a corresponding cavity block. Typically, the non-circular flange of each gate pin has a parallel pair of flat lateral surfaces, and the non-circular recess of the corresponding cavity block also has a parallel pair of flat lateral surfaces for non-rotatably fitting on the non-circular flange of the gate pin.

According to a preferred embodiment of the present invention, each of the first and second gate pins has a forward end formed with a gate forming groove whose depth progressively reduces toward the first and second molding cavities. More specifically, the first cavity block has a runner groove connected to the above-mentioned corner portion of the first molding cavity, wherein the gate forming groove of the first gate pin includes an outlet groove portion which is substantially equal in depth to the first molding cavity, an inlet groove portion which is substantially equal in depth to the runner groove, and an intermediate inclined groove portion which progressively reduces in depth from the inlet groove portion to the outlet groove portion. Similarly, the gate forming groove of the second gate pin includes an outlet groove portion which is substantially equal in depth to the second molding cavity, and an inclined groove portion which progressively reduces in depth toward the outlet groove portion. The advantages of such an embodiment will be described later.

According to a second aspect of the present invention, there is provided a process for resin-packaging semiconductor devices by using a mold device which comprises a first cavity block having a first molding cavity, a second cavity block having a second molding cavity in corresponding relation to the first molding cavity, and a gate for injecting a resin material into the first and second cavities through a runner, the gate being defined between an opposed pair of first and second gate pins at a corresponding corner portion of each molding cavity, the first gate pin being separate from but removably insertable into the first cavity block, the second gate pin being separate from but removably insertable into the second cavity block, the gate being directly open to both of the first and second molding cavities, the process comprising the steps of:

placing a leadframe between the first and second cavity blocks in a manner such that a semiconductor device mounted on the leadframe is located in a space defined by the first and second molding cavities;

clamping the first and second cavity blocks against each other; and injecting the resin material simultaneously into the first and second molding cavities through the runner and the gate.

According to the process described above, since the gate is located at the corner of each molding cavity, the resulting resin package of the semiconductor device will have an excess gate resin portion or burr (excess runner resin portion or burr) at the same corner. Thus, the excess gate resin burr can be removed by cutting more easily at the corner than at any side surface portion is of the package. Further, even if the vestige or trace of the burr remains at the corner, it will not be outstanding in appearance and will not adversely affect the dimensional accuracy of the package. Moreover, the corner location for the gate is also advantageous in that the resin-packaging may be performed with respect to a QFP type semiconductor device wherein the leads project out of the package from its four sides.

Other objects, features and advantages of the present invention will become apparent from the following description of the preferred embodiments given with reference to the accompanying drawings.

BRIEF DESCRIPTION OF THE DRAWINGS

In the accompanying drawings:

FIG. 5a is an enlarged sectional view taken along lines X2—X2 in FIG. 4a;

FIG. 5b is an enlarged sectional view taken along lines X3—X3 in FIG. 4a;

FIG. 9c is an enlarged sectional view taken along lines X5—X5 in FIG. 9a;

FIG. 11c is an enlarged sectional view taken along lines X6—X6 in FIG. 11a;

DETAILED DESCRIPTION OF THE PREFERRED EMBODIMENTS

Figure 1:
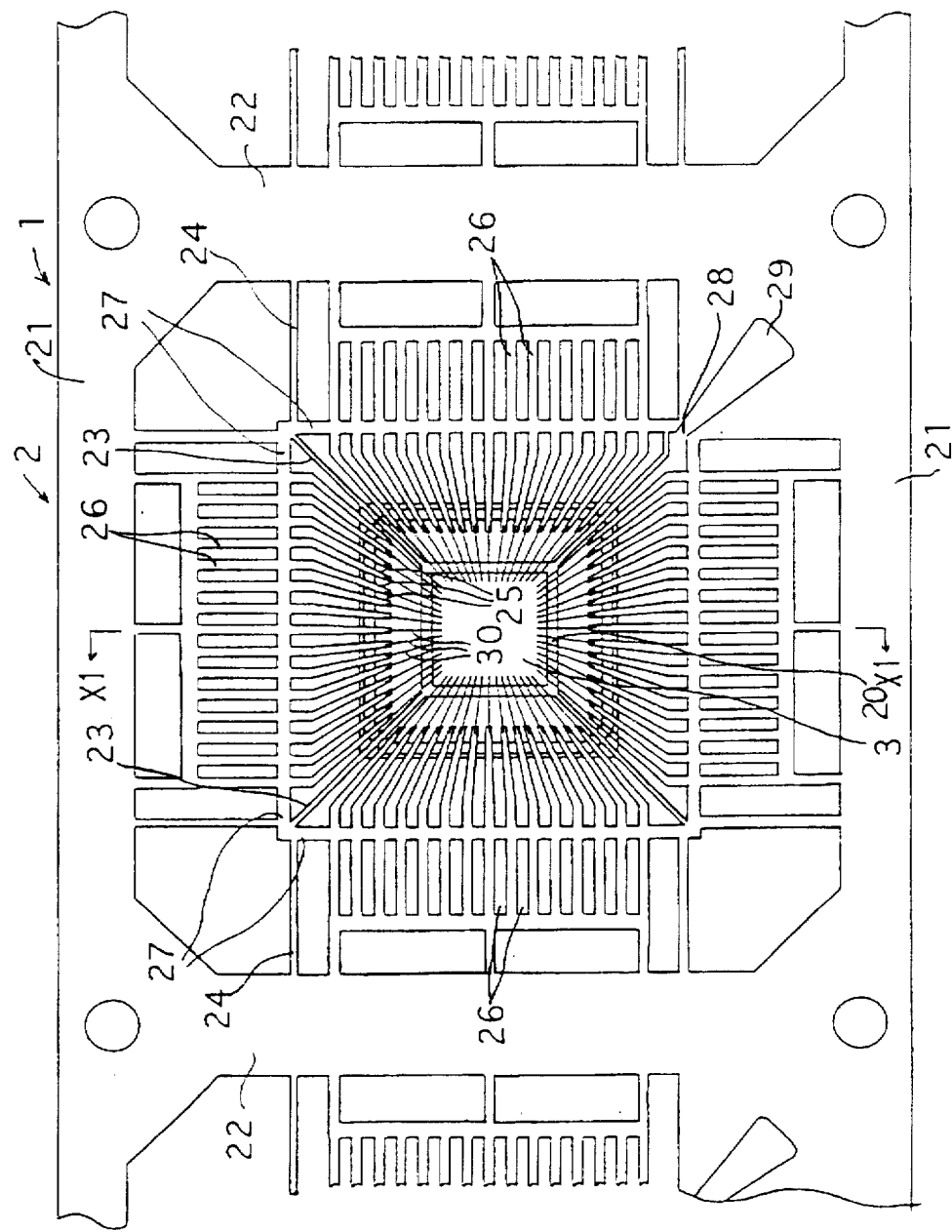
FIG. 1 is a fragmentary plan view showing a semiconductor device intermediate to which the present invention may be advantageously applied.
Figure 2:
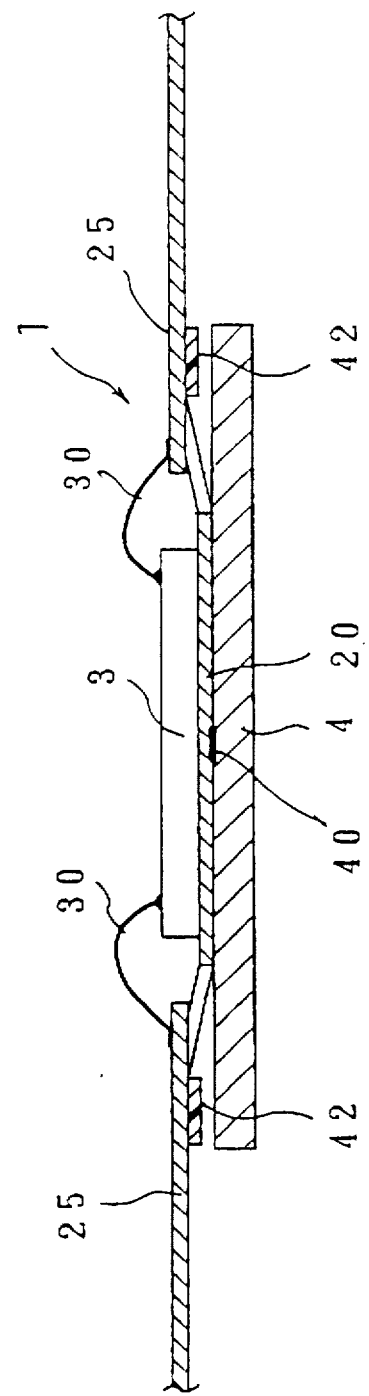
FIG. 2 is a sectional view taken on lines X1—X1 in FIG. 1.

FIGS. 1 and 2 of the accompanying drawings illustrate an example of semiconductor device intermediate which is to be packaged according to the present invention. The semiconductor device intermediate generally represented by reference numeral 1 is a precursor of quad-type or QFP-type semiconductor devices and includes a leadframe 2 which is a long strip made of a suitable metal.

The leadframe 2 includes a pair of longitudinally extending side bands 21 connected together by a plurality of section bars 22 (only two of them shown) spaced longitudinally of the leadframe at a constant pitch. Each two adjacent section bars 22 define a unit region used for making a single semiconductor device.

Specifically, a rectangular or square die pad 20 for mounting a semiconductor chip 3 is supported centrally between each two adjacent section bars 22 by means of suspension bars 23 and support bars 24, and a rectangular or square tie frame 27 surrounds the die pad 20. The tie frame 27 is integrally formed with a multiplicity of inwardly extending inner leads 25 and a multiplicity of outwardly extending outer leads 26. The semiconductor chip 3 is electrically connected to the respective inner leads 25 by means of wires 30 which may be made of gold for example.

At one of the four corners of the square tie frame 27 is provided a discontinuous portion 28 which merges with a cutout 29. This cutout has the function of allowing upward flow of a fluid resin material from below the leadframe 2 at the time of molding a resin package, as described hereinafter.

As shown in FIG. 2, the underside of the die pad 20 is attached to a metallic heat sink plate 4 at a portion 40. Further, the underside of the respective inner leads 25 is attached to an insulating tape 42 which extends in a rectangular form (see FIG. 1). The insulating tape 42 serves to positionally retains the respective inner leads 25 which are arranged at a minute pitch for preventing them from mutually coming into shorting contact while preventing them from coming into direct contact with the heat sink plate 4. It should be understood here that the present invention is also applicable to semiconductor devices which have no heat sink plate and no insulating tape.

Figure 3:
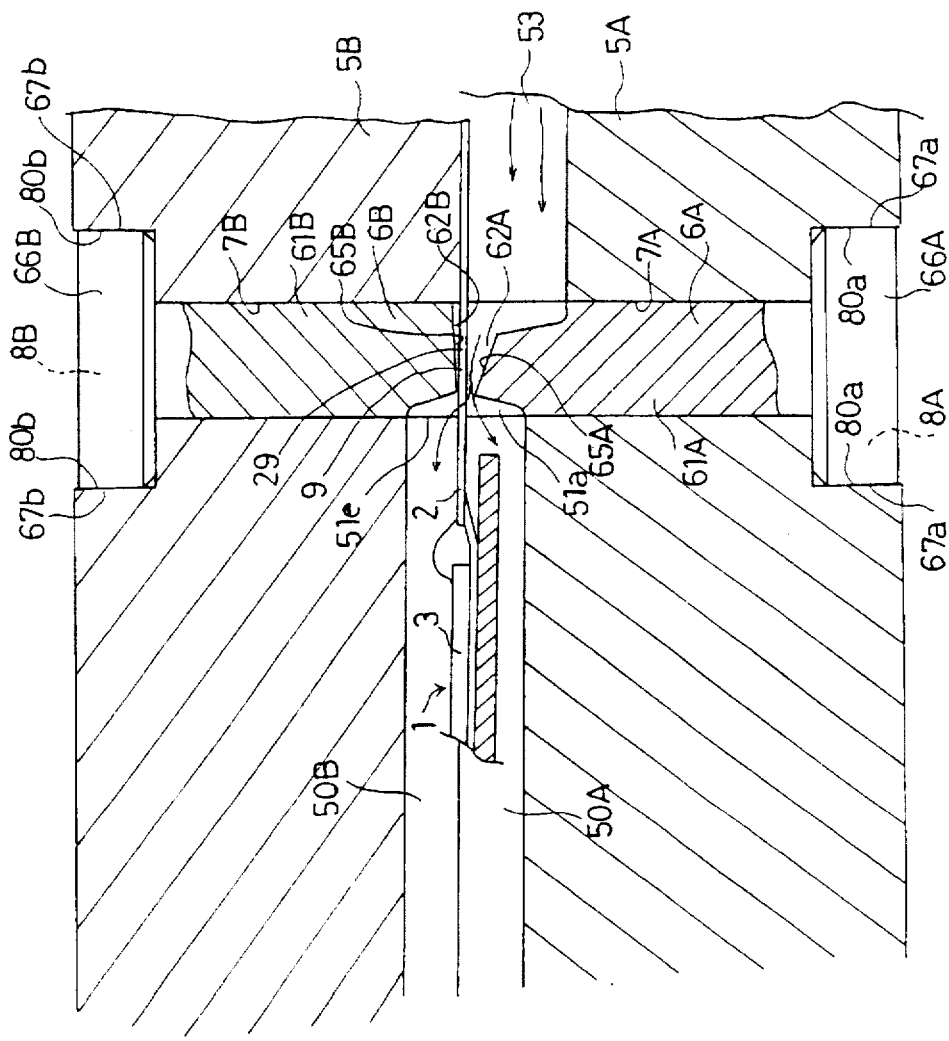
FIG. 3 is a fragmentary sectional view showing a principal portion of a mold device embodying the present invention.

FIG. 3 shows a mold device used for resin-packaging the semiconductor device intermediate 1 illustrated in FIGS. 1 and 2. The e mold device mainly comprises a lower cavity block 5A, an upper cavity block 5B, a first gate pin 6A inserted in the lower cavity block 5A, and a second gate pin 6B inserted in the upper cavity block 5B. Though not illustrated, the mold device also includes a runner block, a vertically spaced pair of clamping members, and a resin supply device (including a pot and a plunger) as required for transfer molding.

As shown in FIGS. 4a through 5b, the lower cavity block 5A has an upper surface formed with a rectangular or square molding cavity 50A (lower molding cavity) and a runner groove 53. The cavity 50A and the runner groove 53 are bounded or defined by a continuous raised portion 54A slightly projecting upward from the upper surface of the lower cavity block 5A. The molding cavity 50A has four corners 51a–51d, and one end 53a of the runner groove 53 is connected to one corner 51a of the cavity 50A. The other end 53b of the runner groove 53 is connected to a runner (not shown) of the unillustrated runner block, thereby allowing supply of a fluid resin material to the runner groove 53.

Figure 4A:
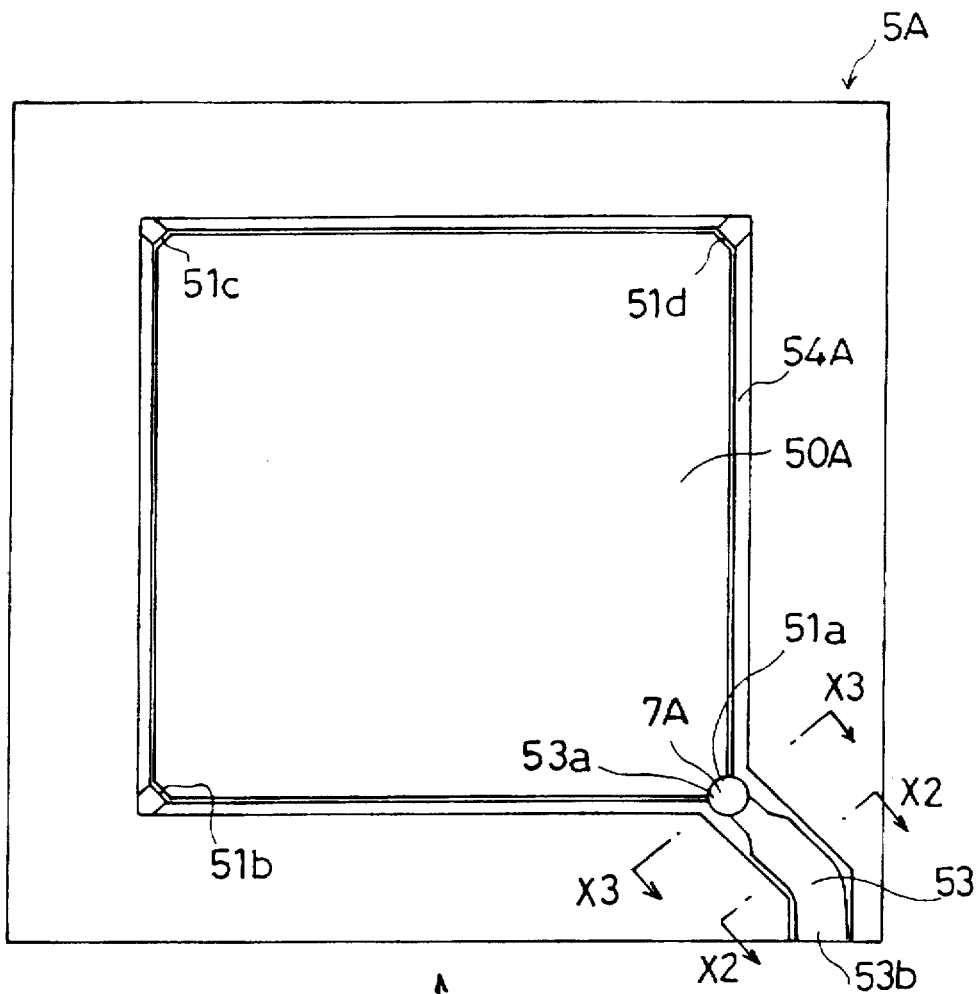
FIG. 4a is a plan view showing a lower cavity block of the same mold device.
Figure 4B:
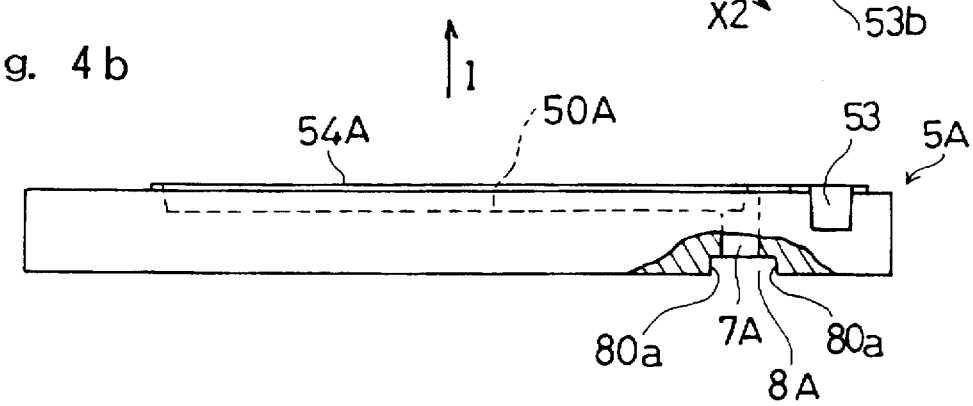
FIG. 4b is a front view, partially in section, of the lower cavity block.
Figure 5A:
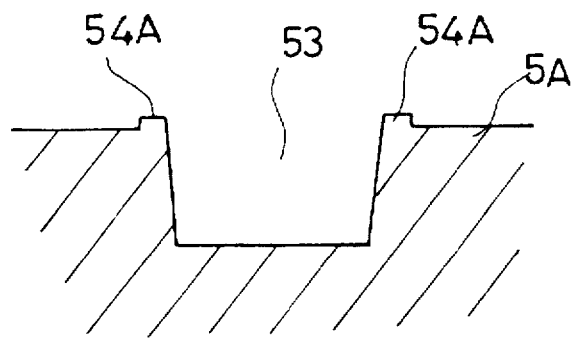
Figure 5B:
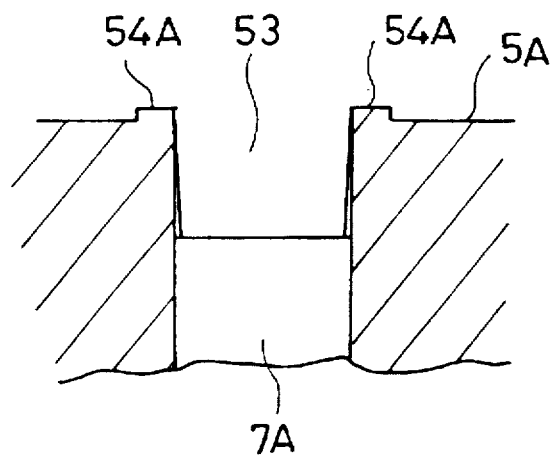

The above-mentioned one corner 51a of the molding cavity 50A is formed with a circular pin insertion bore 7A vertically penetrating through the wall thickness of the lower cavity block 5A for allowing insertion of the first gate pin 6A (FIG. 3). As best shown in FIG. 4b, the underside of the lower cavity block 5A is formed with a recess 8A at the position of the pin insertion bore 7A. The recess 8A is utilized for positionally holding the first gate pin 6A when the latter is inserted in the pin insertion bore 7A, as described hereinafter.

Figure 6A:
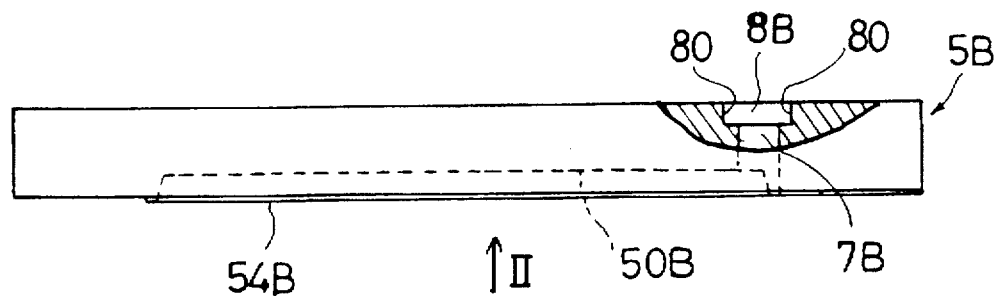
FIG. 6a is a front view, partially in section, showing an upper cavity block of the same mold device.
Figure 6B:
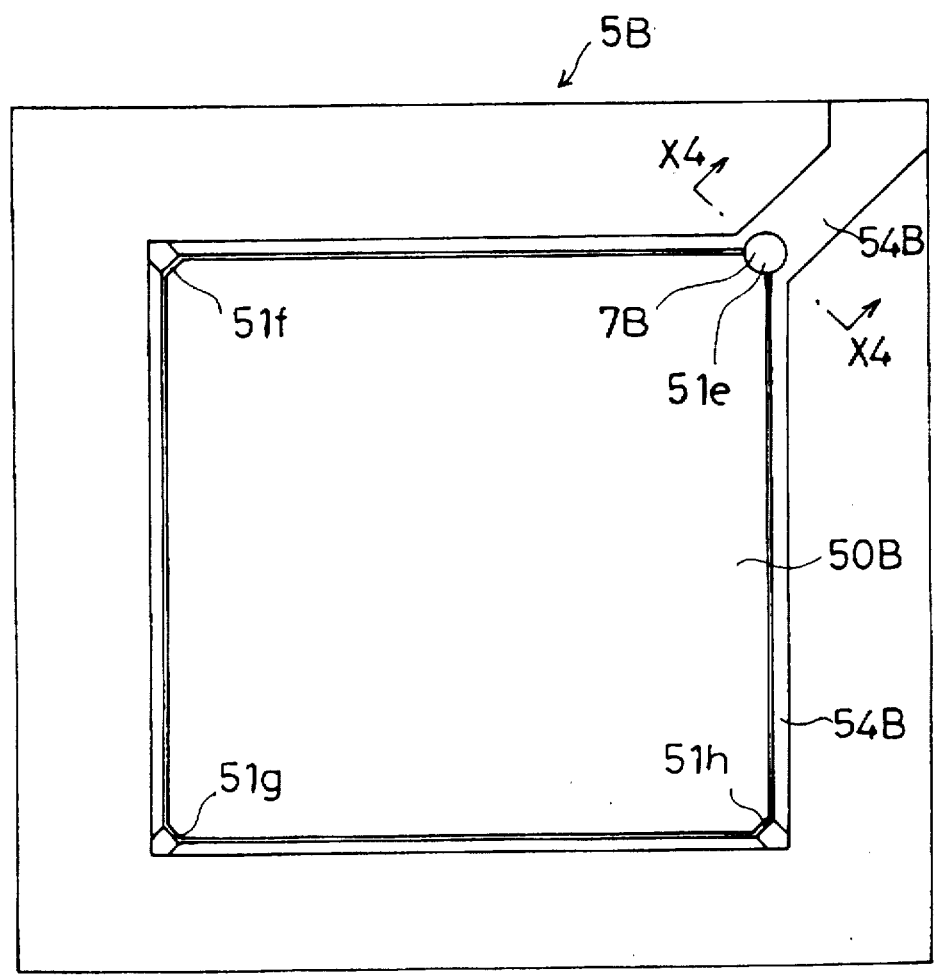
FIG. 6b is a bottom view of the upper cavity block.
Figure 7:
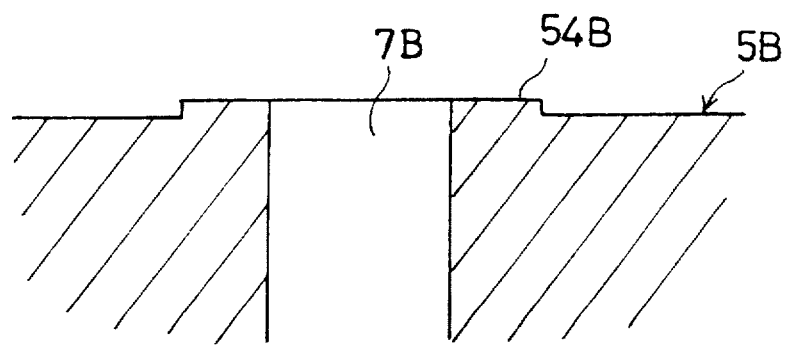
FIG. 7 is an enlarged sectional view taken along lines X4—X4 in FIG. 6b.

As shown in FIGS. 6a through 7, the underside of the upper cavity block 5B is formed with a molding cavity 50B (upper molding cavity) corresponding in configuration and size to the lower molding cavity 50A. The upper molding cavity 50B has four corners 51e–51h, and one corner 51e of the cavity 50B corresponding to the above-mentioned one corner 51a of the lower molding cavity 50A is formed with a circular pin insertion bore 7B vertically penetrating through the wall thickness of the upper cavity block 5B for allowing insertion of the second gate pin 6B (FIG. 3). As best shown in FIG. 6b, the upper surface of the upper cavity block 5B is formed with a recess 8B at the position of the pin insertion bore 7B. The recess 8B is utilized for positionally holding the second gate pin 6B when the latter is inserted in the pin insertion bore 7B.

Unlike the lower cavity block 5A, the upper cavity block 5B has no runner groove. However, the upper cavity block 5B is formed with a continuous raised portion 54B slightly projecting downward from the underside of the upper cavity block 5B in facing relation to the raised portion 54A and runner groove 53 of the lower cavity block 5A. Thus, when clamping the upper and lower cavity blocks 5A, 5B together for molding, the leadframe 2 of the semiconductor device intermediate 1 can be intimately clamped between the raised portions 54A, 54B of both cavity blocks with a high reliability.

Figure 8A:
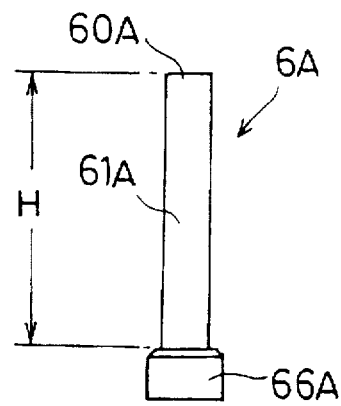
FIG. 8a is a front view showing a first gate pin of the same mold device.
Figure 8B:
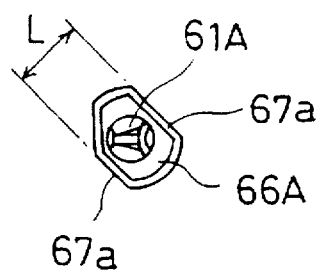
FIG. 8b is a plan view of the first gate pin.
Figure 9A:
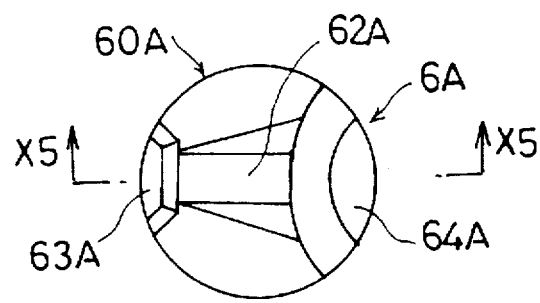
FIG. 9a is an enlarged plan view showing the forward end of the first gate pin.
Figure 9B:
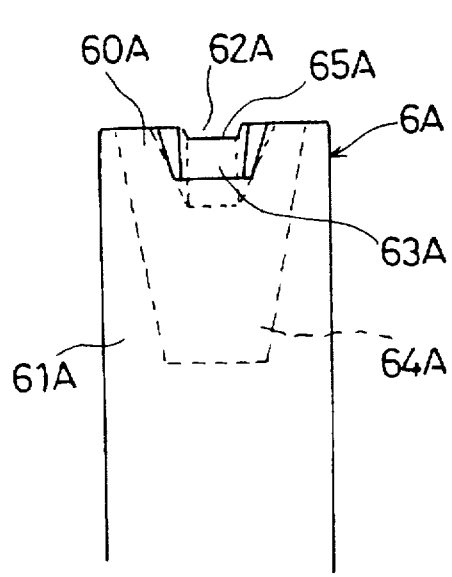
FIG. 9b is an enlarged side view of the forward end of the first gate pin.
Figure 9C:
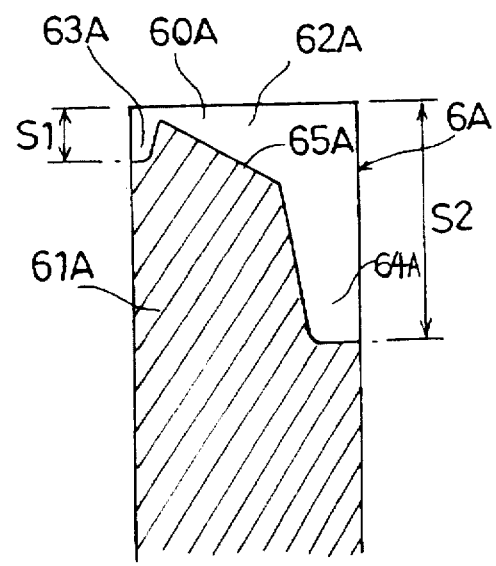

As illustrated in FIGS. 8a through 9c, the first gate pin 6A includes a stem 61A which is circular in cross-section and has a predetermined length H. The stem 61A has a forward end 60A which is provided with a gate-forming groove 62A for allowing passage of a fluid resin material into the cavity 50A of the lower cavity block 5A (see FIG. 3). Specifically, as shown in FIG. 9c, the gate-forming groove 62A includes an outlet groove portion 63A with a depth S1 corresponding to the depth of the cavity 50A, an inlet groove portion 64A with a depth S2 corresponding to the depth of the runner groove 53 (FIG. 3), and an intermediate inclined groove portion 65A whose depth progressively reduces from the inlet terminal groove portion 64A toward the outlet groove portion 63A.

Further, as shown in FIGS. 8a and 8b, the first gate pin 6A also includes an enlarged flange 66A located at the rear end of the stem 61A. The flange 66A is non-circular in cross. Specifically, the flange 66A has a parallel pair of flat lateral surfaces 67a spaced by a suitable amount L. The flange 66A is received in the recess 8A (FIG. 3) which also has a parallel pair of flat lateral surfaces 80a. Thus, the flange 66A can be fitted in the recess 8A only when the lateral surfaces 67a of the flange 66A angularly coincide with the lateral surfaces 80a of the recess 8A. Further, once fitted, the flange 66A is prevented from rotating relative to the recess 8A, so that the orientation of the gate-forming groove 62A is appropriately retained.

Figure 10A:
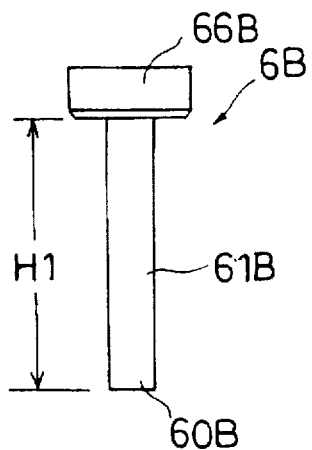
FIG. 10a is a front view showing a second gate pin of the same mold device.
Figure 10B:
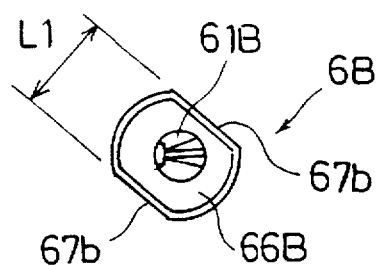
FIG. 10b is a bottom view of the second gate pin.
Figure 11A:
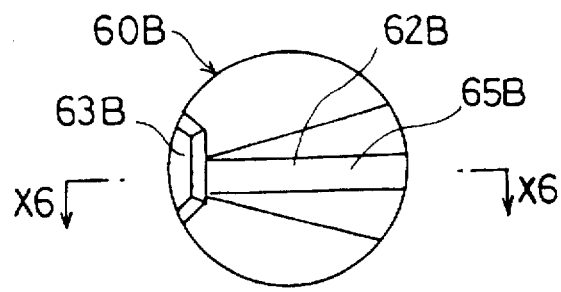
FIG. 11a is an enlarged bottom view showing the forward end of the second gate pin.
Figure 11B:
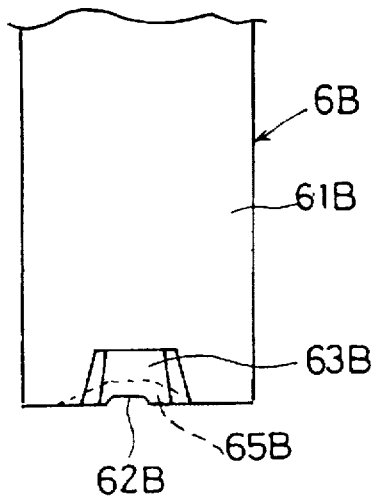
FIG. 11b is an enlarged side view of the forward end of the second gate pin.
Figure 11C:
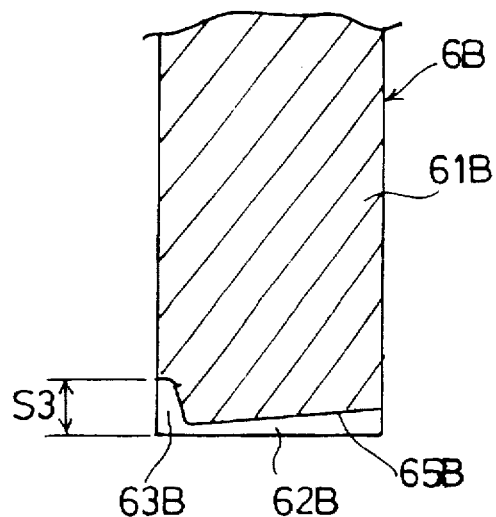

As illustrated in FIGS. 10a through 11c, the second gate pin 6B also includes a stem 61B which is circular in cross-section and has a predetermined length H1. The stem 61B has a forward end 60B which is provided with a gate-forming groove 62A for allowing passage of a fluid resin material into the cavity 50B of the upper cavity block 5B (see FIG. 3). As best shown in FIG. 11c, the gate-forming groove 62B includes an outlet groove portion 63B with a depth S3 corresponding to the depth of the cavity 50B, and an inclined groove portion 65B whose depth progressively reduces toward the outlet groove portion 63B.

Further, as shown in FIGS. 10a and 10b, the second gate pin 6B also includes an enlarged flange 66B located at the rear end of the stem 61B. Again, the flange 66B is rendered cross-sectionally non-circular by forming a parallel pair of flat lateral surfaces 67b spaced by a suitable amount L1. The flange 66B is received in the recess 8B (FIG. 3) which also has a parallel pair of flat lateral surfaces 80b. Thus, the flange 66B can be fitted in the recess 8B only when the lateral surfaces 67b of the flange 66B angularly coincide with the lateral surfaces 80b of the recess 8B, so that the gate-forming groove 62B is appropriately oriented.

The mold device described above may be used for packaging the semiconductor device intermediate 1 (FIGS. 1 and 2) in the following manner.

In the first step, the first and second gate pins 6A, 6B (see FIG. 3) are preliminarily fitted in the pin insertion bores 7A, 7B, respectively, of the lower and upper cavity blocks 5A, 5B. At this time, the flanges 66A, 66B of the respective gate pins 6A, 6B serve as a stopper for determining the inserting amount of the respective gate pins. Thus, if the stem length H, HI (FIGS. 8a and 10a) of the respective gate pins 6A, 6B is previously set at a predetermined value, there is no need for performing troublesome adjustment with respect to the inserting amount of the respective gate pins.

Further, as previously described, the lateral surfaces 67a of the flange 66A of the first gate pin 6A need be angularly adjusted to coincide with the lateral surfaces 80a of the recess 8A of the lower cavity block 5A for performing appropriate insertion of the first gate pin 6A into the corresponding pin insertion bore 7A. Similarly, the lateral surfaces 67b of the flange 66B of the second gate pin 6B need be angularly adjusted to coincide with the lateral surfaces 80b of the recess 8B of the upper cavity block 5B for performing appropriate insertion of the second gate pin 6B into the corresponding pin insertion bore 7B. Therefore, the orientation of the respective gate-forming grooves 62A, 62B of the first and second gate pins 6A, 6B can be easily made to coincide with the extending direction of the runner groove 53, consequently providing an appropriate gate 9 between the first and second gate pins 6A, 6B.

In the next process step, the leadframe 2 is placed between the two cavity blocks 5A, 5B in a manner such that each tie frame 27 of the leadframe 2 is clamped between the respective raised portions 54A, 54B of the cavity blocks 5A, 5B with the semiconductor chip 3 located within the space defined by the cavities 50A, 50B of the respective cavity blocks 5A, 5B, as shown in FIG. 3. At this time, the cutout 29 of the leadframe 2 need be positioned between the first and second gate pins 6A, 6B, so that the gate 9 is open to both cavities 50A, 50B to bring them into communication with the runner groove 53.

In this condition, a fluid resin material is supplied to the runner groove 53 for simultaneously flowing into the respective Cavities 50A, 50B through the gate 9. As a result, the fluid resin material can be injected in the respective cavities 50A, 50B at substantially the same pressure above and below the leadframe 2, so that the leadframe 2 is prevented from warping upward or downward under the resin injection pressure.

Figure 12:
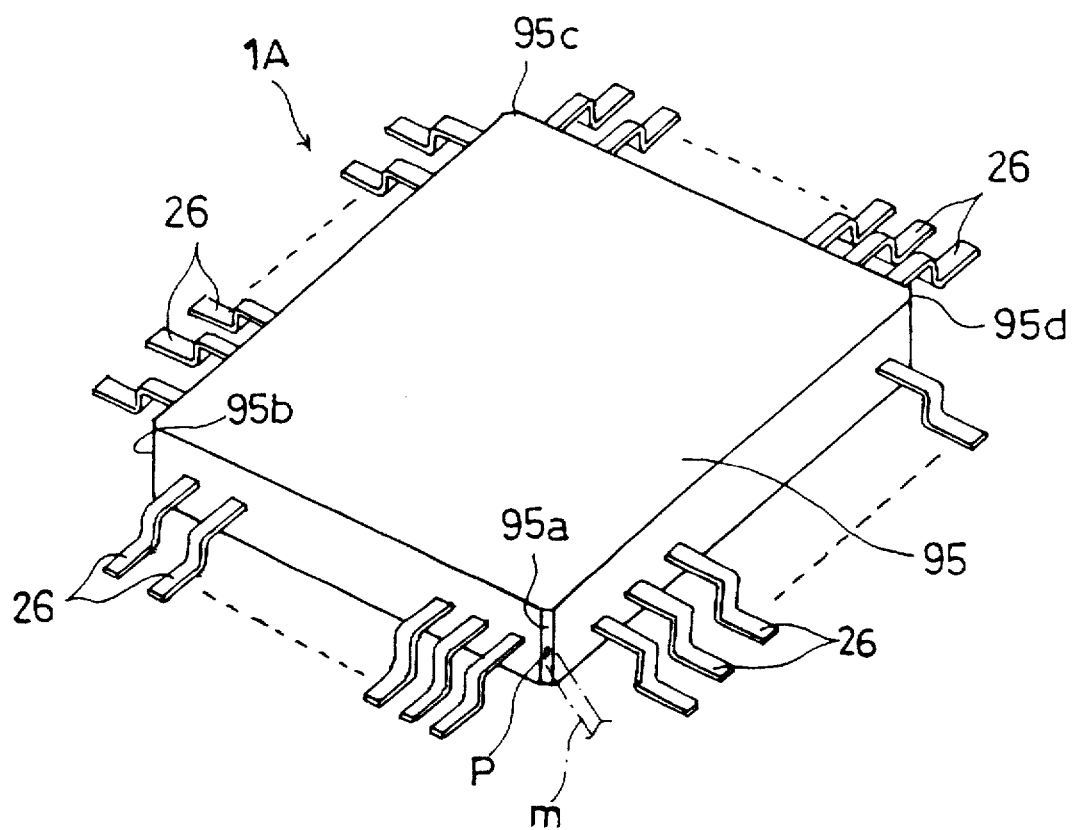
FIG. 12 is a perspective view showing a packaged semiconductor device obtained by using the mold device.
Figure 13:
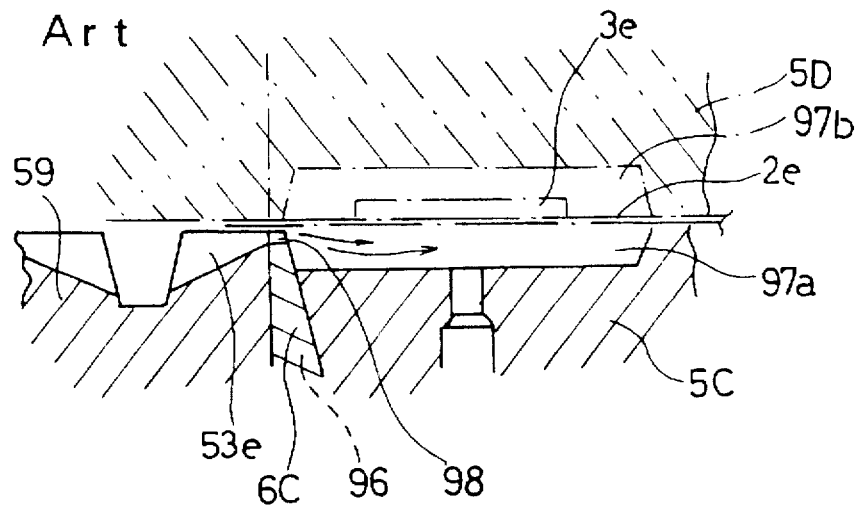
FIG. 13 is a sectional view showing a prior art mold device for packaging semiconductor devices.
Figure 14:
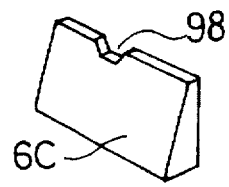
FIG. 14 is a perspective view showing a gate insert incorporated in the prior art mold device.
Figure 15:
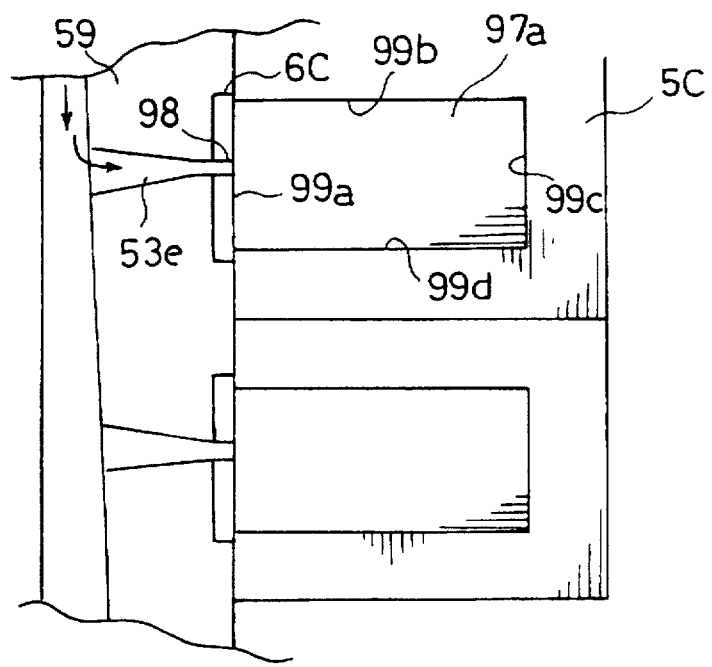
FIG. 15 is an enlarged plan view showing a lower cavity block of the prior art mold device.

The resin-packaging process finishes by opening the mold device upon hardening of the resin material. After the packaging process, the outer leads 26 extending out of the molded resin package is cut off the leadframe 2 and electrically separated from each other by partially removing the tie frame 27 between the respective outer leads 26. Finally, as shown in FIG. 12, the outer leads 26 are bent into a crank form to provide a product semiconductor device 1A. In FIG. 12, the resin package which is represented by reference numeral 95 is shown to have a rectangular or square form with four chamfered corners 95a–95d.

When the mold device is opened, the molded resin package 95 has an excess runner resin portion m at one corner 95a of the package 95, as indicated by the phantom lines in FIG. 12. However, the excess resin portion m may be easily removed by cutting after the resin-packaging step, and the vestige P of the excess resin portion m may be made visually non-outstanding. In particular, since the inclined groove portions 65A, 65B of the gate-forming grooves 62A, 62B of the respective gate pins 6a, 6B progressively approach each other toward the cavities 50A, 50B (see FIG. 3), the excess resin portion m is dimensionally constricted to a large extent near the molded package 95, thereby additionally facilitating removal of the excess resin portion m while making its vestige or trace P even smaller.

On the other hand, the two gate pins 6A, 6B forming the gate 9 may leave their respective traces or vestiges on the molded resin package 95. However, the traces of the gate pins 6A, 6B are very small and only located at the above-mentioned one corner 95a of the package 95. Therefore, the traces of the gate pins 6A, 6B at the corner 95a do not make much visual difference from the other chamfered corners 95b–95d, nor are they detrimental to the appearance of the package 95 as a whole.

Repetitive use of the mold device may result in wear of the respective gate pins 6A, 6B near the gate 9. In such an event, one or both of the gate pins 6A, 6B alone need only be replaced, and such replacement may be effected very easily and quickly by removal and insertion of the gate pins.

The present invention being thus described, it is obvious that the same may be varied in many ways. For instance, the specific configurations and dimensions of the various components of the mold device are not limited to those of the illustrated embodiment, and the packaging process may be performed in a different manner. Further, the present invention is also applicable to resin-packaging of various types of semiconductor devices other than QFP type semiconductor devices. Moreover, the gate-forming grooves 62A, 62B of the respective gate pins 6A, 6B may have a flat groove portion in place of the respective inclined groove portions 65A, 65B. Further, each of the first and second cavity blocks 5A, 5B may have a plurality of molding cavities for molding a plurality of resin packages at the same time. Such variations are not to be regarded as a departure from the spirit and scope of the invention, and all such variations as would be obvious to those skilled in the art are intended to be included within the scope of the following claims.

I claim:

1. A mold device for resin-packaging semiconductor devices comprising:

a first cavity block having a first molding cavity;

a second cavity block having a second molding cavity in corresponding relation to the first molding cavity; and a gate for injecting a resin material into the first and second cavities through a runner;

wherein the gate is defined between an opposed pair of first and second gate pins at a corresponding corner portion of each molding cavity, the first gate pin being separate from but removably insertable into the first cavity block, the second gate pin being separate from but removably insertable into the second cavity block, the gate being directly open to both of the first and second molding cavities.

2. The mold device according to claim 1, wherein each of the first and second gate pins has a forward end formed with a gate forming groove whose depth progressively reduces toward the first and second molding cavities.

3. The mold device according to claim 2, wherein the first cavity block has a runner groove connected to said corner portion of the first molding cavity, the gate forming groove of the first gate pin including an outlet groove portion which is substantially equal in depth to the first molding cavity, an inlet groove portion which is substantially equal in depth to the runner groove and an intermediate inclined groove portion which progressively reduces in depth from the inlet groove portion to the outlet groove portion.

4. The mold device according to claim 2, wherein the gate forming groove of the second gate pin includes an outlet groove portion which is substantially equal in depth to the second molding cavity, and an inclined groove portion which progressively reduces in depth toward the outlet groove portion.

5. The mold device according to claim 1, wherein each of the first and second gate pins has a stem which is circular in cross section, each of the first and second cavity blocks having a circular pin insertion bore for removably inserting the stem.

6. The mold device according to claim 5, wherein each of the first and second gate pins has a rear end formed with a non-circular flange for non-rotatably fitting in a non-circular recess which is formed in a corresponding cavity block.

7. The mold device according to claim 6, wherein the non-circular flange of each said gate pin has a parallel pair of flat lateral surfaces, the non-circular recess of said corresponding cavity block also having a parallel pair of flat lateral surfaces for non-rotatably fitting on the non-circular flange of each said gate pin.

* * * * *